(12) United States Patent
Tanaka et al.

(10) Patent No.: US 7,686,982 B2
(45) Date of Patent: Mar. 30, 2010

(54) CONDUCTIVE FILLER

(75) Inventors: Norihito Tanaka, Tokyo (JP); Tsuyoshi Shiratori, Tokyo (JP)

(73) Assignee: Asahi Kasei EMD Corporation, Tokyo (JP)

( * ) Notice: Subject to any disclaimer, the term of this patent is extended or adjusted under 35 U.S.C. 154(b) by 0 days.

(21) Appl. No.: 12/306,859

(22) PCT Filed: Jun. 26, 2007

(86) PCT No.: PCT/JP2007/062740

§ 371 (c)(1),
(2), (4) Date: Dec. 29, 2008

(87) PCT Pub. No.: WO2008/001740

PCT Pub. Date: Jan. 3, 2008

(65) Prior Publication Data

US 2009/0194745 A1 Aug. 6, 2009

(30) Foreign Application Priority Data

Jun. 30, 2006 (JP) .............................. 2006-181291
Nov. 27, 2006 (JP) .............................. 2006-318175

(51) Int. Cl.
*H01B 1/02* (2006.01)
*H01B 1/22* (2006.01)

(52) U.S. Cl. ...................................... 252/514; 252/512

(58) Field of Classification Search ................. 252/514, 252/512
See application file for complete search history.

(56) References Cited

U.S. PATENT DOCUMENTS

| 5,476,726 | A | * | 12/1995 | Harada et al. ................ 428/643 |
| 6,228,904 | B1 | * | 5/2001 | Yadav et al. ................. 523/210 |
| 6,706,219 | B2 | * | 3/2004 | Nguyen ....................... 252/511 |
| 7,081,214 | B2 | * | 7/2006 | Matsuba et al. ............. 252/512 |
| 7,108,806 | B2 | * | 9/2006 | Xiao et al. ................... 252/511 |
| 2008/0206488 | A1 | * | 8/2008 | Chung et al. ................ 427/596 |
| 2009/0020733 | A1 | * | 1/2009 | Hirakawa et al. ....... 252/519.33 |
| 2009/0139608 | A1 | * | 6/2009 | Tanaka et al. ................. 148/24 |

FOREIGN PATENT DOCUMENTS

| JP | A-05-050286 | 3/1993 |
| JP | A-05-228685 | 9/1993 |
| JP | A-06-238479 | 8/1994 |
| JP | A-08-187591 | 7/1996 |
| JP | A-08-206874 | 8/1996 |
| JP | A-2004-223559 | 8/2004 |
| JP | A-2004-363052 | 12/2004 |
| JP | A-2005-005054 | 1/2005 |
| WO | WO 2006/080247 | 8/2006 |
| WO | WO 2006/109573 | 10/2006 |

\* cited by examiner

*Primary Examiner*—Douglas Mc Ginty
(74) *Attorney, Agent, or Firm*—Morgan Lewis & Bockius LLP

(57) ABSTRACT

Disclosed is a conductive filler which can be fusion-bonded under lower temperature conditions (with the peak temperature of not less than 181° C.) than the reflow heat treatment conditions for an Sn-37Pb eutectic solder. This conductive filler is applicable to heat-resistant uses similar to those of the Sn-37Pb eutectic solder. The conductive filler is a mixture of first metal particles composed of an alloy having a chemical composition including 25-40% by mass of Ag, 2-8% by mass of Bi, 5-15% by mass of Cu, 2-8% by mass of In and 29-66% by mass of Sn, and second metal particles composed of an alloy having a chemical composition including 5-20% by mass of Ag, 10-20% by mass of Bi, 1-15% by mass of Cu and 50-80% by mass of Sn. In the mixture, 20-10,000 parts by mass of the second metal particles are contained per 100 parts by mass of the first metal particles.

5 Claims, 2 Drawing Sheets

CONDUCTIVE FILLER

The present application is a U.S. National Phase Application of International Application No. PCT/JP2007/062740 (filed Jun. 26, 2007) which claims the benefit of Japanese Patent Application No. 2006-181291 (filed Jun. 30, 2006) and Japanese Patent Application No. 2006-318175 (filed Nov. 27, 2006), all of which are hereby incorporated by reference in their entireties.

TECHNICAL FIELD

The present invention relates to a conductive filler used in bonding materials for electric and electronic devices, particularly for a lead-free soldering material and a conductive adhesive.

BACKGROUND ART

Solders are generally used for bonding metal materials, and are supposedly alloy materials having a melting temperature range (a range from a solidus temperature to a liquidus temperature) of 450° C. or less. Conventionally, when electronic components are mounted on printed boards, an Sn-37Pb eutectic solder of 183° C. in melting point is used and the reflow heat treatment is performed mainly in the temperature range of about 200° C. to 230° C. The reflow heat treatment condition is generally set at a temperature range of 10 to 50° C. higher than the melting point of a solder alloy.

However, recently, as in the environmental regulations of the EU (RoHS directive), the problem with the hazardousness of Pb arises and making solders lead-free rapidly progresses in view of preventing contamination of the environment and human bodies. In such a situation, it is now becoming general that as a substitute for the Sn-37Pb eutectic solder, a lead-free solder composed of Sn-3.0Ag-0.5Cu having a melting point of about 220° C. (see Patent Document 1) is used and the reflow heat treatment is performed at a temperature range of about 240° C. to 260° C.

Meanwhile, since the above-mentioned lead-free solder, having a melting point of about 220° C. and mainly composed of Sn has a higher melting point than that of the Sn-37Pb eutectic solder, the reflow heat treatment condition necessary during use must be naturally a higher temperature. Recently, for suppressing thermal damage to electric and electronic devices, soldering at a temperature as low as possible is demanded and bonding materials which are not only lead-free but also have a heat resistive performance at the conventional reflow heat treatment condition corresponding to the Sn-37Pb eutectic solder have been studied.

As components reducing the melting points of lead-free solder alloys, Bi, In, Zn and the like have been confirmed to be effective, but the melting point reduction is sometimes insufficient depending on the amount ratios of them. Bi improves wettability of a solder alloy to a substrate, but is liable to segregate on solidifying, bringing about a brittle crystal texture and a poor ductility. Therefore, when it is added to the solder alloy at a certain amount or more, the mechanical strength is outstanding reduced (see Patent Documents 2 and 3). It is a rare resource and a very expensive material. Therefore, its addition at a large amount to a solder alloy results in a large cost increase (see Patent Documents 4 and 5). Zn is inexpensive and has favorable mechanical properties, and then is expected to be put in practical use. However, Zn has a very high activity and properties of being easily reacted and easily oxidized. Therefore, a solder alloy paste containing Zn exhibits a poor paste stability and a low corrosion resistance. Further, bonding of Zn with Cu forms not a Cu—Sn intermetallic compound layer but a Cu—Zn intermetallic compound layer on the interface. The Cu—Zn intermetallic compound layer has such problems as remarkable strength deterioration under a high temperature and high humidity environment (see Patent Document 6).

The present inventors previously has proposed lead-free conductive materials capable of connecting at a lower heat treatment temperature than that of the Sn-37Pb eutectic solder (see Patent Documents 7, 8, 9 and 10). However, since these conductive materials have a feature in exhibiting a raised lowest melting point after the connection by the heat treatment and developing the connection stability, they have neither a melting point which does not change before and after the connection nor repairability, as is the case with common solder materials.

Patent Document 1: JP-A-05-050286
Patent Document 2: JP-A-05-228685
Patent Document 3: JP-A-08-206874
Patent Document 4: JP-A-08-187591
Patent Document 5: International publication WO 2006/080247 pamphlet
Patent Document 6: JP-A-06-238479
Patent Document 7: JP-A-2004-223559
Patent Document 8: JP-A-2004-363052
Patent Document 9: JP-A-2005-005054
Patent Document 10: International publication WO 2006/109573 pamphlet

DISCLOSURE OF INVENTION

Problem to Be Solved by the Invention

The present invention has been achieved in consideration of the above-mentioned situation, and has an object to provide a conductive filler which is capable of melt-bonding at a lower temperature condition than the reflow heat treatment condition of the Sn-37Pb eutectic solder, that is, at a peak temperature of 181° C., which can be used as a bonding material in the same applications requiring heat resistance as those of the Sn-37Pb eutectic solder, that is, without melting at 160° C., and whose melting point is not substantially raised through the heat treatment during the connection. It is also an object of the present invention to provide a solder paste using the conductive filler.

Means for Solving the Problem

As a result of exhaustive studies to solve the above-mentioned problems, the present inventors have achieved the present invention.

That is, a first aspect of the present invention is a conductive filler characterized in that the conductive filler is a mixture of first metal particles comprising an alloy having a composition of 25 to 40% by mass of Ag, 2 to 8% by mass of Bi, 5 to 15% by mass of Cu, 2 to 8% by mass of In and 29 to 66% by mass of Sn, and second metal particles comprising an alloy having a composition of 5 to 20% by mass of Ag, 10 to 20% by mass of Bi, 1 to 15% by mass of Cu and 50 to 80% by mass of Sn; and a mixing ratio thereof is 20 to 10,000 parts by mass of the second metal particles to 100 parts by mass of the first metal particles.

It is preferable that the mixture has at least one melting point which is observed as an endothermic peak in differential scanning calorimetry (DSC) in each of two temperature ranges of 165° C. to 200° C. and 320° C. to 380° C.; the second metal particles comprise an alloy having a composition of 5 to 15% by mass of Ag, 10 to 20% by mass of Bi, 5 to 15% by mass of Cu and 50 to 80% by mass of Sn; and the mixing ratio is 20 to 1,000 parts by mass of the second metal particles to 100 parts by mass of the first metal particles.

It is preferable that the mixture has at least one exothermic peak of a metastable alloy phase at 110° C. to 130° C., which is observed as an exothermic peak in differential scanning calorimetry (DSC), and at least one melting point which is observed as an endothermic peak in each of two temperature ranges of 165 to 200° C. and 320° C. to 380° C.; the second metal particles comprise an alloy having a composition of 5 to 15% by mass of Ag, 10 to 20% by mass of Bi, 5 to 15% by mass of Cu and 50 to 80% by mass of Sn; and the mixing ratio is 20 to 200 parts by mass of the second metal particles to 100 parts by mass of the first metal particles.

It is preferable that the mixture has at least one exothermic peak of a metastable alloy phase at 131 to 150° C., which is observed as an exothermic peak in differential scanning calorimetry (DSC), and at least one melting point at 165 to 200° C., which is observed as an endothermic peak; the second metal particles comprise an alloy having a composition of 10 to 20% by mass of Ag, 10 to 20% by mass of Bi, 1 to 5% by mass of Cu and 55 to 79% by mass of Sn; and the mixing ratio is 1 to 420 parts by mass of the first metal particles to 100 parts by mass of the second metal particles.

A second aspect of the present invention is a solder paste containing the conductive filler according to the first aspect of the present invention.

ADVANTAGES OF THE INVENTION

The conductive filler of the present invention is capable of melt-bonding at a lower temperature condition than the reflow heat treatment condition of the Sn-37Pb eutectic solder, that is, at a peak temperature of 181° C., and can be used as a bonding material in the same applications requiring heat resistance as those of the Sn-37Pb eutectic solder, that is, without melting at 160° C., and whose melting point is not substantially raised through the heat treatment during the connection. Therefore, bonding materials using the conductive filler of the present invention can reduce thermal damage to components, substrates and peripheral devices during mounting, have repairability, and further have advantages of reducing the manufacturing costs and environmental load.

BEST MODE FOR CARRYING OUT THE INVENTION

The conductive filler of the present invention is characterized in that the conductive filler is a mixture of first metal particles comprising an alloy having a composition of 25 to 40% by mass of Ag, 2 to 8% by mass of Bi, 5 to 15% by mass of Cu, 2 to 8% by mass of In and 29 to 66% by mass of Sn, and second metal particles comprising an alloy having a composition of 5 to 20% by mass of Ag, 10 to 20% by mass of Bi, 1 to 15% by mass of Cu and 50 to 80% by mass of Sn; and the mixing ratio is 20 to 10,000 parts by mass of the second metal particles to 100 parts by mass of the first metal particles. The mixing ratio is more preferably 20 to 1,000 parts by mass of the second metal particles to 100 parts by mass of the first metal particles.

Examples of the mixtures of the first metal particles and the second metal particles, which are preferable as the conductive filler of the present invention, include a mixture of the first metal particles having at least one exothermic peak of a metastable alloy phase at 110° C. to 130° C., which is observed as an exothermic peak in differential scanning calorimetry (DSC), and at least one melting point which is observed as an endothermic peak in each of two temperature ranges of 165 to 200° C. and 320° C. to 380° C., but the second metal particles not having the at least one exothermic peak but having at least one melting point at 165° C. to 200° C., which is observed as an endothermic peak.

They further include a mixture of the first metal particles having at least one exothermic peak of a metastable alloy phase at 110° C. to 130° C., which is observed as an exothermic peak in differential scanning calorimetry (DSC), and at least one melting point which is observed as an endothermic peak in each of two temperature ranges of 165° C. to 200° C. and 320° C. to 380° C., and the second metal particles having at least one exothermic peak of a metastable alloy phase at 131 to 150° C., which is observed as the exothermic peak, and at least one melting point at 165° C. to 200° C., which is observed as an endothermic peak.

Here, the measurement temperature range of the differential scanning calorimetry (DSC) in the present invention is set in the range of 30 to 600° C.; peaks exhibiting an exothermic or endothermic quantity of ±1.5 J/g or more are quantitatively determined as ones originated from measured objects, and peaks of less than that are excluded in view of analysis precision.

Here, "melting point" used in the present invention means a temperature at which melting starts, and Indicates a solidus temperature in differential scanning calorimetry (DSC).

When metal particles are imparted a thermal history of the lowest melting point or more of the metal particles by a heat treatment, the metal particles are melted and bonded. Thereby, a thermal diffusive reaction between metal particles acceleratingly progresses; the metastable alloy phase vanishes; and a new stable alloy phase is formed. That is, the presence of the metastable alloy phase observed as the exothermic peak in DSC has an effect of promoting the thermal diffusive reaction.

The first metal particles are metal particles comprising an alloy having a composition of 25 to 40% by mass of Ag, 2 to 8% by mass of Bi, 5 to 15% by mass of Cu, 2 to 8% by mass of In and 29 to 66% by mass of Sn, and more preferably metal particles comprising an alloy having a composition of 30 to 35% by mass of Ag, 2 to 8% by mass of Bi, 8 to 12% by mass of Cu, 2 to 8% by mass of In, and Sn as the remainder.

The second metal particles are metal particles comprising an alloy having a composition of 5 to 20% by mass of Ag, 10 to 20% by mass of Bi, 1 to 15% by mass of Cu and 50 to 80% by mass of Sn.

The mixing ratio of the second metal particles to the first metal particles in the mixture of the first metal particles and the second metal particles is preferably 20 to 10,000 parts by mass of the second metal particles to 100 parts by mass of the first metal particles.

An example (hereinafter, referred to as "mode 1") of a more preferable composition of the second metal particles is metal particles comprising an alloy having a composition of 5 to 15% by mass of Ag, 10 to 20% by mass of Bi, 5 to 15% by mass of Cu and 50 to 80% by mass of Sn. More preferably, the metal particles comprise an alloy having a composition of 8 to 12% by mass of Ag, 12 to 18% by mass of Bi, 8 to 12% by mass of Cu, and Sn as the remainder.

In the case where the composition of the second metal particles is mode 1, the mixing ratio of the second metal particles to the first metal particles in the mixture of the first metal particles and the second metal particles is preferably 20 to 1,000 parts by mass of the second metal particles to 100 parts by mass of the first metal particles, more preferably 20 to 200 parts by mass of the second metal particles to 100 parts by mass of the first metal particles, still more preferably 40 to 100 parts by mass of the second metal particles to 100 parts by mass of the first metal particles.

An example (hereinafter, referred to as "mode 2") of a more preferable composition of the second metal particles is metal particles comprising an alloy having a composition of 10 to 20% by mass of Ag, 10 to 20% by mass of Bi, 1 to 5% by mass of Cu and 55 to 79% by mass of Sn. More preferably, the metal particles comprise an alloy having a composition of 12 to 18% by mass of Ag, 12 to 18% by mass of Bi, 1 to 5% by mass of Cu, and Sn as the remainder.

In the case where the composition of the second metal particles is mode 2, the mixing ratio of the first metal particles to the second metal particles in the mixture of the first metal particles and the second metal particles is preferably 1 to 420 parts by mass of the first metal particles to 100 parts by mass of the second metal particles, more preferably 1 to 110 parts by mass of the first metal particles to 100 parts by mass of the second metal particles.

The particle size and shape of the metal particles can be determined according to applications. For example, in the solder paste applications, with the printability emphasized, particles having a relatively high sphericity degree of 2 to 40 μm in average particle size are preferably used and particles of 2 to 10 μm in average particle size are more preferably used. Further, when the via fillability is emphasized in via filling In the conductive adhesive applications, particles having a relatively high sphericity degree are preferably used; and in surface mounting of components and the like, deformed particles are preferably used for increasing the contact area.

In general, the surface of fine metal particles is often oxidized. Therefore, for promoting melting and thermal diffusion by the heat treatment in the above applications, at least one of formulating an active agent to remove the oxidized film and pressurizing is preferably performed; both thereof are more preferably performed.

As a method for manufacturing the first metal particles and the second metal particles constituting the conductive filler of the present invention, an inert gas atomization method of a quenching solidification method is desirably employed for forming the metastable alloy phase and the stable alloy phase in the metal particles. The gas atomization method usually uses an inert gas such as nitrogen gas, argon gas or helium gas, but in the present invention, helium gas whose specific gravity is low is preferably used. The cooling rate is preferably 500 to 5,000° C./sec.

The solder paste of the present invention is composed of the conductive filler of the present invention, and a flux comprising a rosin, a solvent, an active agent, a thixotropic agent and the like. The content of the conductive filler in a solder paste is preferably 85 to 95% by mass. The flux is suitable for the surface treatment of the conductive filler composed of metal particles, and promotes melting and thermal diffusion of the metal particles. As the flux, well-known materials can be used, but further addition of an organic amine as an oxidized film removing agent is effective. As required, a solvent may be added to a well-known flux to adjust the viscosity.

EXAMPLES

Hereinafter, the present invention will be described according to the Examples.

Here, the differential scanning calorimetry was conducted under a nitrogen atmosphere at a temperature rising rate of 10° C./min in the range of 30 to 600° C. using "DSC-50", made by Shimadzu Corporation.

(1) Manufacture of First Metal Particles 1.0 kg of Cu particles (purity: 99% by mass or more), 4.8 kg of Sn particles (purity: 99% by mass or more), 3.2 kg of Ag particles (purity: 99% by mass or more), 0.5 kg of Bi particles (purity: 99% by mass or more) and 0.5 kg of In particles (purity: 99% by mass or more) were put in a graphite crucible, and heated up to 1,400° C. and melted under an atmosphere of helium of 99% by volume or more by a high frequency induction heating apparatus. Then, the melted metal was introduced from the tip end of the crucible into an atomizing tank under a helium gas atmosphere, and thereafter atomized to fabricate first metal particles by ejecting helium gas (purity: 99% by volume or more, oxygen concentration: less than 0.1% by volume, pressure: 2.5 MPa) from a gas nozzle installed in the vicinity of the crucible tip end. The cooling rate at this time was set at 2,600° C./sec. The obtained first metal particles were observed by a scanning electron microscope (S-2700, made by Hitachi, Ltd.) and the shape thereof was spherical.

The metal particles were classified using an airflow classifier (TC-15N, made by Nisshin Engineering Inc.) at a setting of 5 μm, and thereafter its overcut powder was again classified at a setting of 15 μm and the obtained undercut powder was recovered. The recovered first metal particles (a) had a volume-average particle size of 4.9 μm.

The first metal particles (a) thus obtained were used as a sample, and subjected to differential scanning calorimetry. As a result, endothermic peaks at 196° C., 359° C. and 415° C. were present for the obtained first metal particles (a), which confirmed that the obtained first metal particles (a) had a plurality of melting points. Further, an exothermic peak at 120° C. was present, which confirmed that they had a metastable alloy phase.

The first metal particles before the classification fabricated by the gas atomization were classified using an airflow classifier (TC-15N, made by Nisshin Engineering Inc.) at a setting of 1.6 μm, and thereafter its overcut powder was again classified at a setting of 20 μm and the obtained undercut powder was recovered. The recovered first metal particles (a') had a volume-aver age particle size of 2.8 μm.

The first metal particles (a') thus obtained were used as a sample, and subjected to differential scanning calorimetry was conducted. As a result, endothermic peaks at 196° C., 360° C. and 409° C. were present for the obtained first metal particles (a'), which confirmed that the obtained first metal particles (a') had a plurality of melting points. Further, an exothermic peak at 121° C. was present, which confirmed that they had a metastable alloy phase.

(2) Manufacture of Second Metal Particles 1.0 kg of Cu particles (purity: 99% by mass or more), 6.5 kg of Sn particles (purity: 99% by mass or more), 1.0 kg of Ag particles (purity: 99% by mass or more) and 1.5 kg of Bi particles (purity: 99% by mass or more) were put in a graphite crucible, and heated up to 1,400° C. and melted under an atmosphere of helium of 99% by volume or more by a high frequency induction heating apparatus. Then, the melted metal was introduced from the tip end of the crucible into an atomizing tank under a helium gas atmosphere, and thereafter atomized to fabricate second metal particles by ejecting helium gas (purity: 99% by volume or more, oxygen concentration: less than 0.1% by volume, pressure: 2.5 MPa) from a gas nozzle installed in the vicinity of the crucible tip end. The cooling rate at this time was set at 2,600° C./sec. The obtained second metal particles were observed by a scanning electron microscope (S-2700, made by Hitachi, Ltd.) and the shape thereof was spherical.

The metal particles were classified using an airflow classifier (TC-15N, made by Nisshin Engineering Inc.) at a setting of 5 µm, and thereafter its overcut powder was again classified at a setting of 15 µm and the obtained undercut powder was recovered. The recovered second metal particles (a) had a volume-average particle size of 4.9 µm.

The second metal particles (a) thus obtained were used as a sample and subjected to differential scanning calorimetry. As a result, endothermic peaks at 194° C. and 350° C. were present for the obtained second metal particles (a), which confirmed that the obtained second metal particles (a) had a plurality of melting points. Further, no characteristic exothermic peak was present.

The second metal particles before the classification fabricated by the gas atomization were similarly classified using an airflow classifier at a setting of 1.6 µm, and thereafter its overcut powder was again classified at a setting of 20 µm and the obtained undercut powder was recovered. The recovered second metal particles (a') had a volume-average particle size of 3.0 µm.

The second metal particles (a) thus obtained were used as a sample, and subjected to differential scanning calorimetry. As a result, endothermic peaks at 193° C. and 348° C. were present for the obtained second metal particles (a'), which confirmed that the obtained second metal particles (a') had a plurality of melting points. Further, no characteristic exothermic peak was present.

Next, 0.25 kg of Cu particles (purity: 99% by mass or more), 6.75 kg of Sn particles (purity: 99% by mass or more), 1.5 kg of Ag particles (purity: 99% by mass or more) and 1.5 kg of Bi particles (purity: 99% by mass or more) were put in a graphite crucible, and heated up to 1,400° C. and melted under an atmosphere of helium of 99% by volume or more by a high frequency induction heating apparatus. Then, the melted metal was introduced from the tip end of the crucible into an atomizing tank under a helium gas atmosphere, and thereafter atomized to fabricate second metal particles by ejecting helium gas (purity: 99% by volume or more, oxygen concentration: less than 0.1% by volume, pressure: 2.5 MPa) from a gas nozzle installed in the vicinity of the crucible tip end. The cooling rate at this time was set at 2,600° C./sec. The obtained second metal particles were observed by a scanning electron microscope (S-2700, made by Hitachi, Ltd.) and the shape thereof was spherical.

The metal particles were classified using an airflow classifier (TC-15N, made by Nisshin Engineering Inc.) at a setting of 5 µm, and thereafter its overcut powder was again classified at a setting of 15 µm and the obtained undercut powder was recovered. The recovered second metal particles (b) had a volume-average particle size of 5.0 µm.

The second metal particles (b) thus obtained were used as a sample, and subjected to differential scanning calorimetry. As a result, endothermic peaks at 199° C. and 340° C. were present for the obtained second metal particles (b), thereby confirming that the obtained second metal particles (b) had a plurality of melting points. Further, an exothermic peak at 143° C. was present, thereby confirming that they had a metastable alloy phase.

Example 3

(3) Manufactures of a Metal Particle Mixture and a Solder Paste

A metal particle mixture (average particle size: 4.9 µm) was fabricated by mixing the first metal particles (a) and the second metal particles (a) in the weight ratio of 100:95. The metal particle mixture was made as a conductive filler in Example 3. A DSC chart obtained by the differential scanning calorimetry of the conductive filler is shown in FIG. 1. As shown in FIG. 1, the presence of endothermic peaks at 193° C. and 356° C. is confirmed. The endothermic peak at 193° C. corresponds to a melting point of 174° C. (melt-starting temperature: solidus temperature). An exothermic peak at 120° C. is characteristically present.

Then, 90.0% by mass of the conductive filler, 6.4% by mass of a rosin flux, 1.6% by mass of triethanolamine (oxidized film removing agent), 0.4% by mass of stearic acid (active agent) and 1.6% by mass of ethylene glycol monohexyl ether (solvent) were mixed, and sequentially subjected to a Solder Softener (SPS-1, made by Malcom) and a defoaming kneader (SNB-350, made by Matsuo Sangyo Co., Ltd.) to fabricate a solder paste.

(4) Confirmations of Melting Point and Bonding Strength

The solder paste was put on an alumina substrate, and subjected to a reflow heat treatment in a nitrogen atmosphere at a peak temperature of 181° C. The heat treatment apparatus used was a mesh-belt type continuous heat treatment apparatus, made by Koyo Thermo System Co., Ltd. The temperature profile condition employed (hereinafter, also referred to as "peak-181° C. heat treatment") was as follows: the entire process took 5 min; the temperature reached 108° C. in 1 min and 30 sec from the heat treatment starting; thereafter, the temperature was gradually raised and reached a peak temperature of 181° C. in 3 min and 15 sec; then the temperature was gradually decreased and became 146° C. at the heat treatment finishing.

The solder paste after the heat treatment was made as a sample, on which the differential scanning calorimetry was conducted. A DSC chart obtained by this measurement is shown in FIG. 2. As shown in FIG. 2, the presence of endothermic peaks at 193° C., 349° C. and 383° C. was confirmed. The endothermic peak at 193° C. corresponds to a melting point of 170° C.

Further, the solder paste was printed in 2 mm×3.5 mm on a Cu substrate, and, after a chip was mounted, the printed solder paste was subjected to the peak-181° C. heat treatment in a nitrogen atmosphere by the above-mentioned heat treatment method to fabricate a sample. The printed pattern formation used a printing machine, "MT-320TV", made by Micro-tec Co., Ltd., a metal mask as a mask, and a urethane-made squeegee as a squeegee. The aperture of the mask was 2 mm×3.5 mm; the thickness was 100 µm. The printing conditions were printing rate: 10 mm/sec, printing pressure: 0.1 MPa, squeegee pressure: 0.2 MPa, back pressure: 0.1 MPa, attack angle: 20°, clearance: 0 mm, and printing frequency: 1 time. The chip used was a Cu chip of 2 mm×2 mm and 0.5 mm in thickness.

Further, the chip bonding strength in the shearing direction of the fabricated sample was measured at ordinary temperature (25° C.) at a pushing rate of 10 mm/min using a push-pull gage, and was 15.6 MPa in terms of per unit area.

Then, the solder paste was put on an alumina substrate, and subjected to a reflow heat treatment in a nitrogen atmosphere at a peak temperature of 204° C. The heat treatment apparatus used was the same as described before. The temperature profile condition employed (hereinafter, also referred to as "peak (204° C.) heat treatment") was as follows: the entire process was 5 min; the temperature reached 111° C. in 1 min and 30 sec from the heat treatment starting; thereafter, the temperature was gradually raised and reached a peak temperature of 204° C. in 3 min and 15 sec; then the temperature was gradually decreased and became 162° C. at the heat treatment finishing. This temperature profile was assumed to be a reflow condition used in bonding of the common Sn-37Pb eutectic solder.

The solder paste after the heat treatment was made a sample, on which the differential scanning calorimetry was conducted. The presence of endothermic peaks at 193° C., 349° C. and 389° C. was confirmed. The endothermic peak at 193° C. corresponds to a melting point of 170° C.

Then, the solder paste was printed in 2 mm×3.5 mm on a Cu substrate by the same method as described above, and, after a chip was mounted, the printed solder paste was subjected to the peak-204° C. heat treatment in a nitrogen atmosphere by the above-mentioned heat treatment method to fabricate a sample.

Further, the chip bonding strength in the shearing direction of the fabricated sample was measured at ordinary temperature (25° C.) at a pushing rate of 10 mm/min using a push-pull gage, and was 21.2 MPa in terms of per unit area.

Examples 1 and 2, and Examples 4 to 9

Respective metal particle mixtures in which the mixing ratios of the first metal particles (a) and the second metal particles (a) or the second metal particles (b) are changed as described in Table 1 in the conductive filler of Example 3 described above, were fabricated, and made respective conductive fillers of Examples 1 and 2 and Examples 4 to 9. The conductive fillers were made into pastes by the same method as in Example 3; the pastes were subjected to the heat treatment; thereafter, the chip bonding strengths were measured, and the results are shown in Table 1. A DSC chart obtained by the differential scanning calorimetry of the conductive filler of Example 5 is shown in FIG. 3; and a DSC chart obtained by the differential scanning calorimetry of the solder paste fabricated from the conductive filler after the peak-181° C. heat treatment is shown in FIG. 4.

Comparative Examples 1 to 4

Further, in Table 1, the results are shown which were for the case of the metal particles being the first metal particles (a) alone (Comparative Example 1), for the case of the metal particles being the second metal particles alone (Comparative Example 2), and also results of measurement of conventional solder materials. Comparative Example 3 is for an Sn-37Pb eutectic solder; and Comparative Example 4 is for an Sn-3.0Ag-0.5Cu lead-free solder, these solders being conventional solder materials.

As is clear from the results of Table 1, Examples 2, 3, 5 and 6 exhibit bonding strengths surpassing that of the Sn-37Pb eutectic solder in the peak temperature (204° C.; heat treatment. Examples 1, 4, and 7 to 9 also have bonding strengths in sufficiently practicable levels.

Since the lowest melting point after the heat treatment for every Example is nearly 170° C., every solder paste is conceivably adaptable, without any problem, to applications of surface mounting requiring the thermal resistance of 160° C., as is the case where the Sn-37Pb eutectic solder is used.

Examples 10 to 12

Respective conductive fillers in which the mixing ratios of the first metal particles (a') and the second metal particles (a') were changed were made into pastes by the same method as in Example 3 and subjected to the heat treatment; thereafter, the chip bonding strengths were measured; the results are shown in Table 2 as Examples 10 to 12.

As is clear from the results in Table 2, Examples 11 and 12 exhibit bonding strengths surpassing that of the Sn-37Pb eutectic solder in the peak temperature (204° C.) heat treatment. Example 10 also has a bonding strength of 10 MPa or more, so the solder pastes have bonding strengths in sufficiently practicable levels.

Since the lowest melting point after the heat treatment for every Example is 160° C. or more, every solder paste is assumingly adaptable, without any problem, to applications of surface mounting requiring the thermal resistance of 160° C., as is the case where the Sn-37Pb eutectic solder is used.

As described heretofore, use of the conductive filler of the present invention allows melt-bonding at a lower temperature condition than the reflow heat treatment condition for the Sn-37Pb eutectic solder, that is, at a peak temperature of 181° C., and can provide a bonding material which can be used in applications requiring the same heat resistance as that of the Sn-37Pb eutectic solder, that is, applications requiring the heat resistance of 160° C.

TABLE 1

| | Compositions (weight ratio) | | | Peak (181° C.) heat treatment | | Peak (204° C.) heat treatment | |
|---|---|---|---|---|---|---|---|
| | First metal particles (a) | Second metal particles (a) | Second metal particles (b) | Lowest melting point (° C.) | Bonding strength (MPa) | Lowest melting point (° C.) | Bonding strength (MPa) |
| Comparative Example 1 | 100 | 0 | — | 176 | 6.9 | 174 | 14.1 |
| Example 1 | 100 | 24 | — | 172 | 11.2 | 172 | 17.3 |
| Example 2 | 100 | 47 | — | 171 | 12.3 | 170 | 19.8 |
| Example 3 | 100 | 95 | — | 170 | 15.6 | 170 | 21.2 |
| Example 4 | 100 | 189 | — | 168 | 15.1 | 168 | 16.2 |
| Comparative Example 2 | 0 | 100 | — | 159 | 15.0 | 158 | 15.2 |
| Example 5 | 26 | — | 100 | 176 | 18.7 | 174 | 20.3 |
| Example 6 | 53 | — | 100 | 173 | 16.9 | 173 | 20.3 |
| Example 7 | 105 | — | 100 | 174 | 16.5 | 174 | 18.4 |
| Example 8 | 210 | — | 100 | 172 | 13.3 | 171 | 18.1 |
| Example 9 | 420 | — | 100 | 173 | 12.9 | 170 | 15.1 |
| Comparative Example 3 | Sn—37Pb eutectic solder | | | 183 | 1.1 | 183 | 19.0 |

TABLE 1-continued

| | Compositions (weight ratio) | | | Peak (181° C.) heat treatment | | Peak (204° C.) heat treatment | |
|---|---|---|---|---|---|---|---|
| | First metal particles (a) | Second metal particles (a) | Second metal particles (b) | Lowest melting point (° C.) | Bonding strength (MPa) | Lowest melting point (° C.) | Bonding strength (MPa) |
| Comparative Example 4 | Sn—3.0Ag—0.5Cu lead-free solder | | | 220 | 0.9 | 220 | 3.0 |

TABLE 2

| | Compositions (weight ratio) | | Peak (181° C.) heat treatment | | Peak (204° C.) heat treatment | |
|---|---|---|---|---|---|---|
| | First metal particles (a') | Second metal particles (a') | Lowest melting point (° C.) | Bonding strength (MPa) | Lowest melting point (° C.) | Bonding strength (MPa) |
| Example 10 | 100 | 95 | 166 | 12.9 | 173 | 16.1 |
| Example 11 | 100 | 189 | 165 | 13.2 | 168 | 19.7 |
| Example 12 | 100 | 700 | 163 | 13.5 | 166 | 21.8 |

INDUSTRIAL APPLICABILITY

The conductive filler of the present invention allows melt-bonding at a lower temperature condition (peak temperature of 181° C.) than the reflow heat treatment condition for the Sn-37Pb eutectic solder, and can be expected to be made use of as a bonding material in applications requiring the same heat resistance (required heat resistance of 160° C.).

Figure 1:
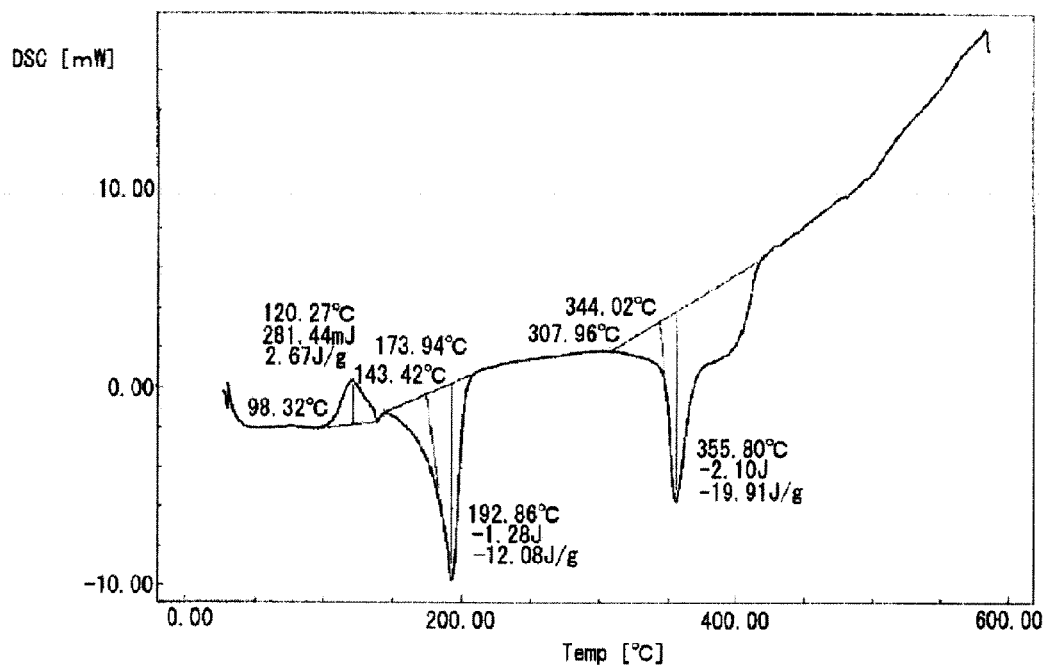
FIG. 1 is a DSC chart obtained by differential scanning calorimetry using a conductive filler as a sample obtained by mixing the first metal particles (a) and the second metal particles (a) fabricated in Example 3 in a weight ratio of 100:95.
Figure 2:
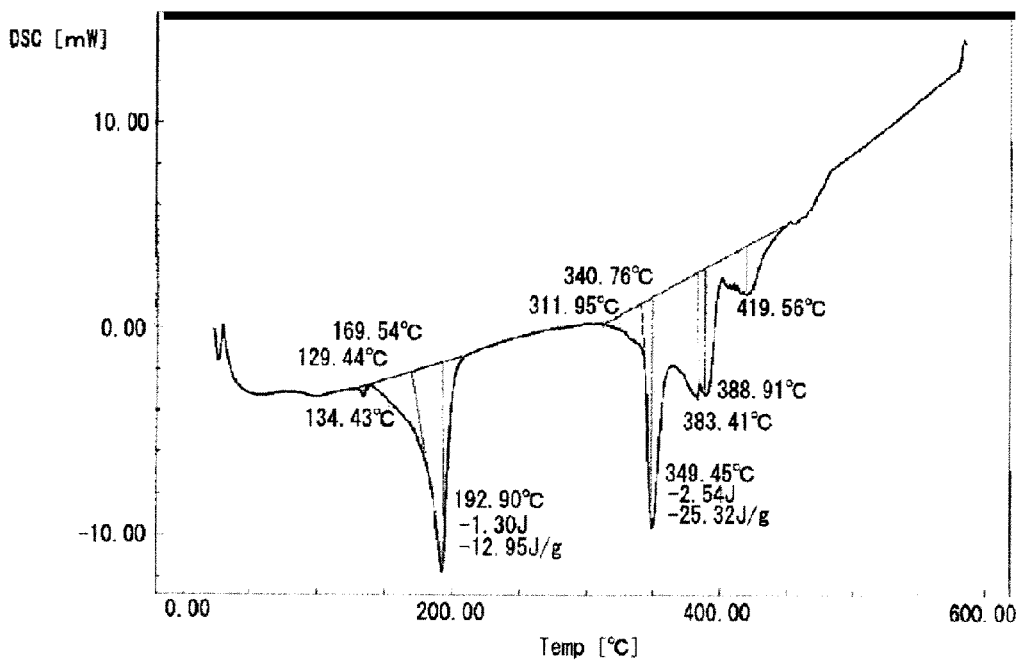
FIG. 2 is a DSC chart obtained by differential scanning calorimetry using a sample obtained by subjecting the solder paste fabricated in Example 3 to a reflow heat treatment at a peak temperature of 181° C. in a nitrogen atmosphere.
Figure 3:
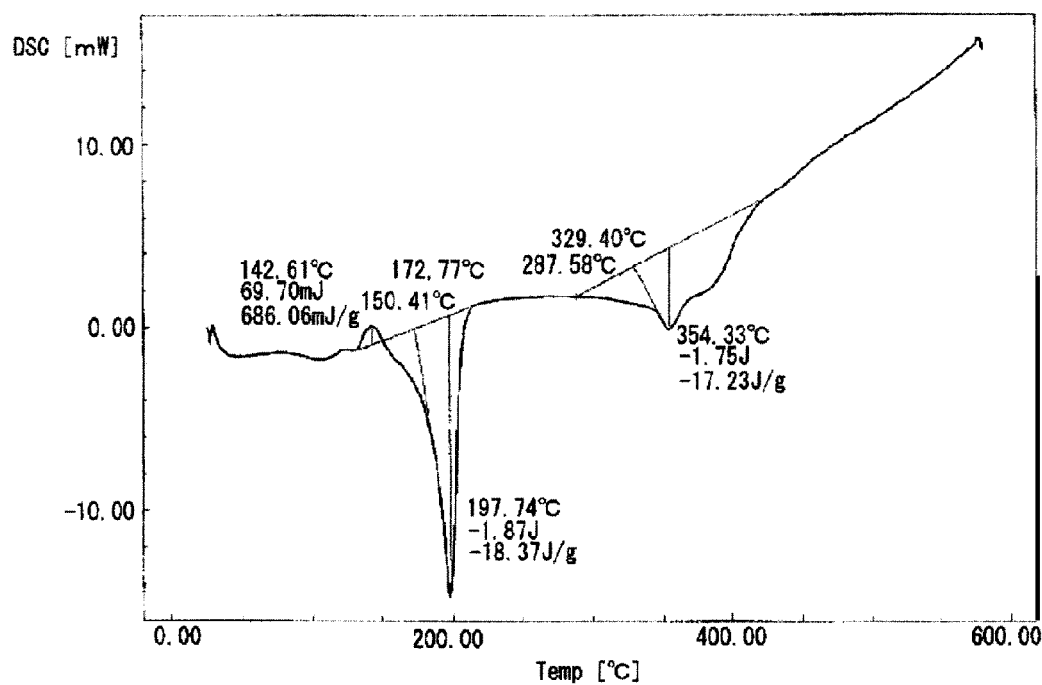
FIG. 3 is a DSC chart obtained by differential scanning calorimetry using a conductive filler as a sample obtained by mixing the first metal particles (a) and the second metal particles (b) fabricated in Example 5 in a weight ratio of 26:100.
Figure 4:
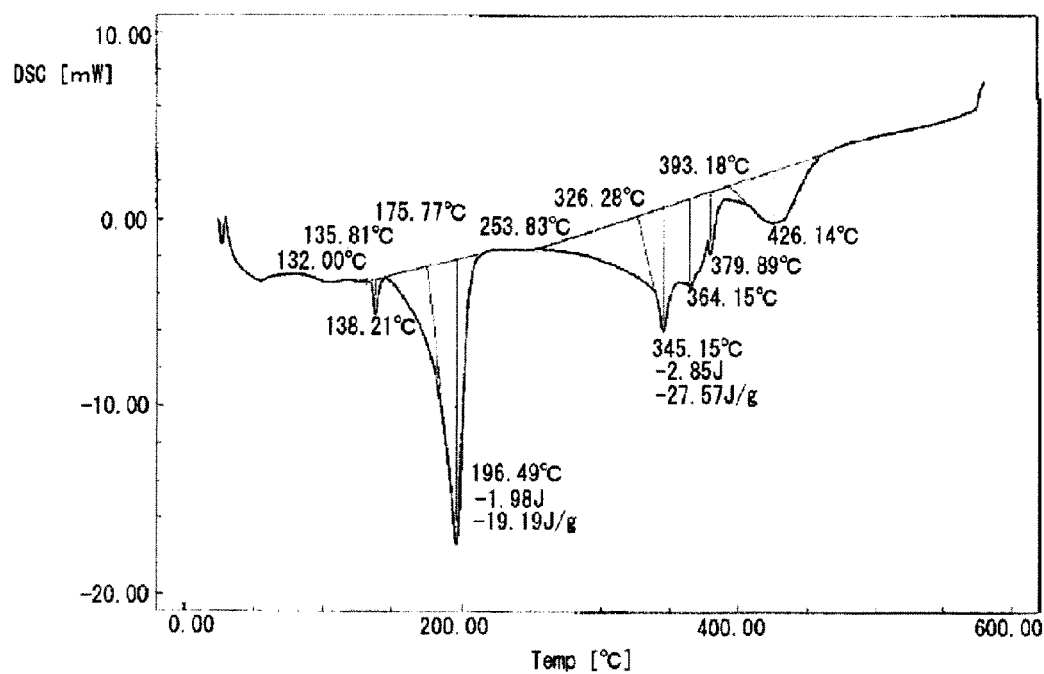
FIG. 4 is a DSC chart obtained by differential scanning calorimetry using a sample obtained by subjecting the solder paste fabricated in Example 5 to a reflow heat treatment at a peak temperature of 181° C. in a nitrogen atmosphere.

The invention claimed is:

1. A conductive filler, characterized in that the conductive filler is a mixture of first metal particles comprising an alloy having a composition of 25 to 40% by mass of Ag, 2 to 8% by mass of Bi, 5 to 15% by mass of Cu, 2 to 8% by mass of In and 29 to 66% by mass of Sn; second metal particles comprising of an alloy having a composition of 5 to 20% by mass of Ag, 10 to 20% by mass of Bi, 1 to 15% by mass of Cu and 50 to 80% by mass of Sn; and a mixing ratio thereof is 20 to 10,000 parts by mass of the second metal particles to 100 parts by mass of the first metal particles.

2. The conductive filler according to claim 1, characterized in that the mixture has at least one melting point which is observed as an endothermic peak in differential scanning calorimetry (DSC) in each of two temperature ranges of 165° C. to 200° C. and 320° C. to 380° C.; the second metal particles comprise an alloy having a composition of 5 to 15% by mass of Ag, 10 to 20% by mass of Bi, 5 to 15% by mass of Cu and 50 to 80% by mass of Sn; and the mixing ratio thereof is 20 to 1,000 parts by mass of the second metal particles to 100 parts by mass of the first metal particles.

3. The conductive filler according to claim 1, characterized in that the mixture has at least one exothermic peak of a metastable alloy phase at 110° C. to 130° C., which is observed as an exothermic peak in differential scanning calorimetry (DSC), and at least one melting point which Is observed as an endothermic peak in each of two temperature ranges of 165 to 200° C. and 320° C. to 380° C.; the second metal particles comprise an alloy having a composition of 5 to 15% by mass of Ag, 10 to 20% by mass of Bi, 5 to 15% by mass of Cu and 50 to 80% by mass of Sn; and the mixing ratio thereof is 20 to 200 parts by mass of the second metal particles to 100 parts by mass of the first metal particles.

4. The conductive filler according to claim 1, characterized in that the mixture has at least one exothermic peak of a metastable alloy phase at 131 to 151° C., which is observed as an exothermic peak in differential scanning calorimetry (DSC), and at least one melting point which is observed as an endothermic peak at 165 to 200° C.; the second metal particles comprise an alloy having a composition of 10 to 20% by mass of Ag, 10 to 20% by mass of Bi, 1 to 5% by mass of Cu and 55 to 79% by mass of Sn; and the mixing ratio thereof is 1 to 420 parts by mass of the first metal particles to 100 parts by mass of the second metal particles.

5. A solder paste comprising the conductive filler according to any one of claims 1 to 4.

* * * * *